US012646661B2

(12) United States Patent (10) Patent No.: US 12,646,661 B2
Shih et al. (45) Date of Patent: Jun. 2, 2026

(54) ELECTRODE OF ENERGY STORAGE ELEMENT AND MANUFACTURING METHOD THEREOF

(71) Applicant: Industrial Technology Research Institute, Hsinchu (TW)

(72) Inventors: Hung-Hsin Shih, Hsinchu City (TW); Kun-Ping Huang, Miaoli County (TW); Chi-Chang Hu, Hsinchu City (TW); Da-Je Hsu, Taoyuan City (TW); Chen-Wei Tai, Hsinchu City (TW)

(73) Assignee: Industrial Technology Research Institute, Hsinchu (TW)

( * ) Notice: Subject to any disclaimer, the term of this patent is extended or adjusted under 35 U.S.C. 154(b) by 401 days.

(21) Appl. No.: 18/404,833

(22) Filed: Jan. 4, 2024

(65) Prior Publication Data

US 2025/0157746 A1 May 15, 2025

(30) Foreign Application Priority Data

Nov. 14, 2023 (TW) ................................. 112143808

(51) Int. Cl.
 *H01G 11/86* (2013.01)
 *C01B 32/186* (2017.01)
 (Continued)

(52) U.S. Cl.
 CPC ........... *H01G 11/86* (2013.01); *C01B 32/186* (2017.08); *C01B 32/194* (2017.08); *C23C 16/26* (2013.01);
 (Continued)

(58) Field of Classification Search
 CPC ........ H01G 11/86; H01G 11/32; H01G 11/36; H01G 11/22; H01G 11/30; H01G 11/34;
 (Continued)

(56) References Cited

U.S. PATENT DOCUMENTS 10,998,552 B2 5/2021 Lanning et al.
2018/0301285 A1* 10/2018 Geier .................. H01G 9/0425
(Continued)

FOREIGN PATENT DOCUMENTS

CN 105489392 4/2016
CN 105923623 9/2016
(Continued)

OTHER PUBLICATIONS

K. P. Huang et al., "Material Analysis of Graphene Nanowall and Application to Supercapacitor Energy Storage Devices", Industrial Materials Magazine, Sep. 2022, with English abstract, pp. 168-177, vol. 429.

(Continued)

*Primary Examiner* — Scott B Geyer
(74) *Attorney, Agent, or Firm* — JCIPRNET

(57) ABSTRACT

A manufacturing method of an electrode of an energy storage element includes: providing a substrate into microwave plasma equipment; introducing a carrier gas and a carbon precursor gas into the microwave plasma equipment; forming multi-layer graphene walls on the substrate through microwave plasma chemical vapor deposition; and immersing the substrate containing the multi-layer graphene walls in an electrolyte solution to perform electrochemical activation treatment, so that ions in the electrolyte solution are intercalated between adjacent graphene walls. A volume ratio of the carrier gas to the carbon precursor gas is 1:10 to 10:1. An electrode of an energy storage element is also provided.

21 Claims, 12 Drawing Sheets

(51) Int. Cl.

| | |
|---|---|
| *C01B 32/194* | (2017.01) |
| *C23C 16/26* | (2006.01) |
| *C23C 16/511* | (2006.01) |
| *C23C 16/56* | (2006.01) |
| *H01G 11/32* | (2013.01) |

(52) U.S. Cl.
CPC ............ *C23C 16/511* (2013.01); *C23C 16/56* (2013.01); *H01G 11/32* (2013.01); *C01B 2204/04* (2013.01); *C01B 2204/22* (2013.01); *C01P 2002/82* (2013.01); *C01P 2002/85* (2013.01); *C01P 2004/03* (2013.01); *C01P 2006/40* (2013.01)

(58) Field of Classification Search
CPC . C01B 32/186; C01B 32/194; C01B 2204/04; C01B 2204/22; C23C 16/26; C23C 16/511; C23C 16/56; C01P 2002/82; C01P 2002/85; C01P 2004/03; C01P 2006/40
See application file for complete search history.

(56) References Cited

U.S. PATENT DOCUMENTS

| | | | | |
|---|---|---|---|---|
| 2019/0109358 A1* | 4/2019 | Chai | ..................... | H01M 12/00 |
| 2021/0108317 A1* | 4/2021 | Ejigu | ..................... | C01B 32/19 |

FOREIGN PATENT DOCUMENTS

| | | |
|---|---|---|
| CN | 107902643 | 4/2018 |
| CN | 107924768 | 4/2018 |
| CN | 107946086 | 4/2018 |
| CN | 108431915 | 8/2018 |
| CN | 108470636 | 8/2018 |
| CN | 109036859 | 12/2018 |
| CN | 109309192 | 2/2019 |
| CN | 110718678 | 1/2020 |
| CN | 111029165 | 4/2020 |
| CN | 112655061 | 4/2021 |
| CN | 112673440 | 4/2021 |
| CN | 110148746 | 7/2021 |
| TW | 201631612 | 9/2016 |
| TW | 201732071 | 9/2017 |
| TW | 201919992 | 6/2019 |

OTHER PUBLICATIONS

"Office Action of Taiwan Counterpart Application", issued on Nov. 1, 2024, p. 1-p. 8.

Hongsen Li et al., "Three-dimensionally ordered porous TiNb2O7 nanotubes: a superior anode material for next generation hybrid supercapacitors", Journal of Materials Chemistry A, vol. 3, Aug. 4, 2015, pp. 16785-16790.

Dattakumar Mhamane et al., "Silica-assisted bottom-up synthesis of graphene-like high surface area carbon for highly efficient ultracapacitor and Li-ion hybrid capacitor applications", Journal of Materials Chemistry A, vol. 4, Apr. 21, 2016, pp. 5578-5591.

Rohan Gokhale et al., "Oligomer-salt derived 3D, heavily nitrogen doped, porous carbon for Li-ion hybrid electrochemical capacitors application", Carbon, vol. 80, Dec. 2014, pp. 462-471.

Tengfei Zhang et al., "High energy density Li-ion capacitor assembled with all graphene-based electrodes", Carbon, vol. 92, Oct. 2015, pp. 106-118.

Liu, Tengyu et al., "Research progress on the application of graphene for lithium-ion capacitors", Energy Storage Science and Technology, vol. 9, No. 4, Jul. 2020, with English abstract thereof, pp. 1-14.

Ji Hoon Lee et al., "Functionalized Graphene for High Performance Lithium Ion Capacitors", ChemSusChem, vol. 5, Issue 12, Oct. 30, 2012, pp. 1-7.

* cited by examiner

---- Graphene of Example 1
—·— Graphene of Example 2
—— Graphene of Example 3

---- Graphene of Example 13
—-— Graphene of Example 14
—— Graphene of Example 12

---- Graphene of Example 13
—— Graphene of Example 14
—— Graphene of Example 12

Electrode not being electrochemically activated
(titanium sheet grown with graphene of Example 3)

Electrode being electrochemically activated
(titanium sheet grown with graphene of Example A)

—— Electrode not being electrochemically activated
(titanium sheet grown with graphene of Example 4)

---- Electrode being electrochemically activated
(titanium sheet grown with graphene of Example C)

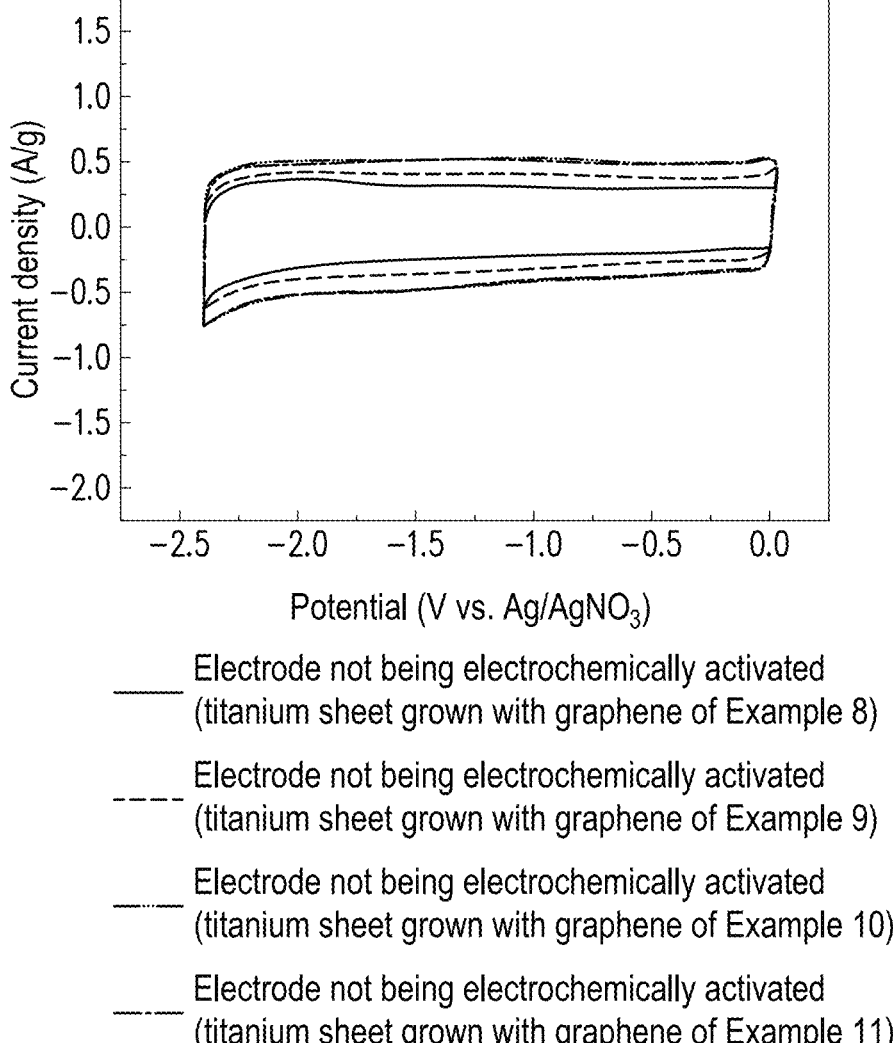

Electrode not being electrochemically activated
(titanium sheet grown with graphene of Example 8)

Electrode not being electrochemically activated
(titanium sheet grown with graphene of Example 9)

Electrode not being electrochemically activated
(titanium sheet grown with graphene of Example 10)

Electrode not being electrochemically activated
(titanium sheet grown with graphene of Example 11)

FIG. 8A

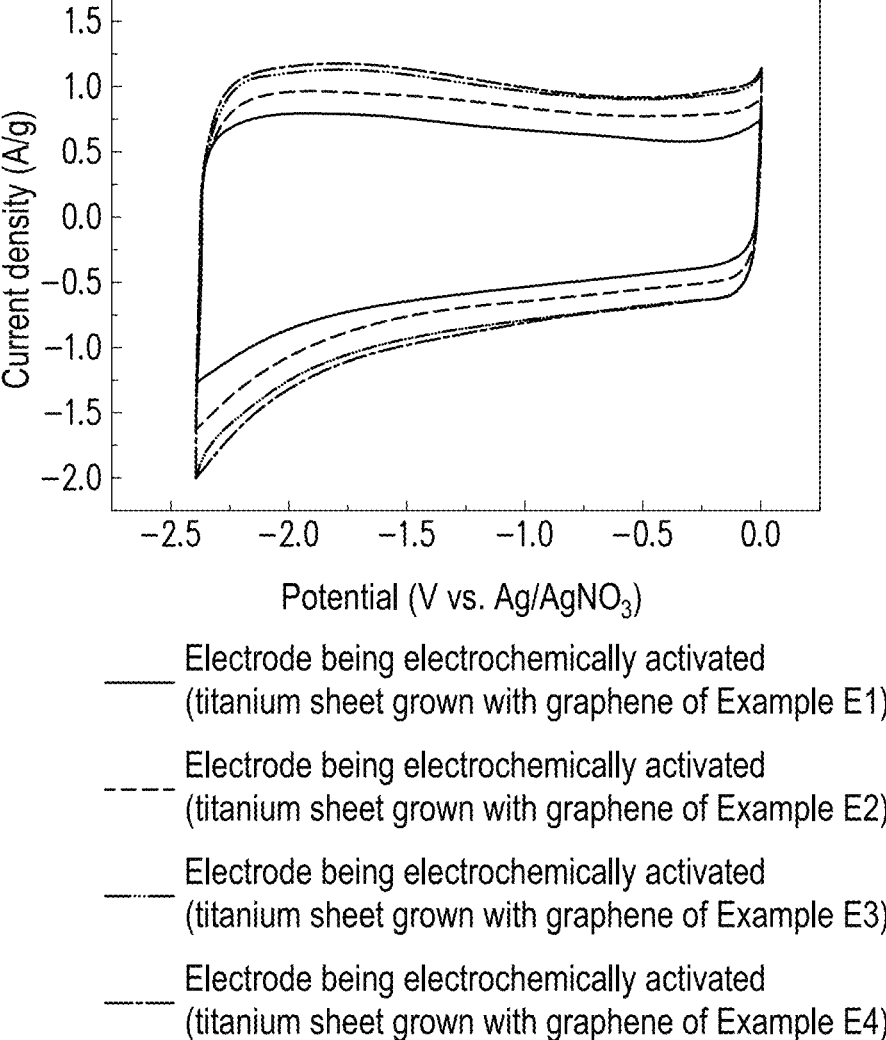

Electrode being electrochemically activated
(titanium sheet grown with graphene of Example E1)

Electrode being electrochemically activated
(titanium sheet grown with graphene of Example E2)

Electrode being electrochemically activated
(titanium sheet grown with graphene of Example E3)

Electrode being electrochemically activated
(titanium sheet grown with graphene of Example E4)

FIG. 8B

ELECTRODE OF ENERGY STORAGE ELEMENT AND MANUFACTURING METHOD THEREOF

CROSS-REFERENCE TO RELATED APPLICATION

This application claims the priority benefit of Taiwan application serial no. 112143808, filed on Nov. 14, 2023. The entirety of the above-mentioned patent application is hereby incorporated by reference herein and made a part of this specification.

TECHNICAL FIELD

The disclosure relates to an energy storage element and a manufacturing method thereof.

BACKGROUND

Electrostatic double-layer capacitors (EDLCs or supercapacitors) feature short charging time, long cycle life, good temperature resistance, etc., and are green and environmentally friendly. Therefore, electrostatic double-layer capacitors are widely used in related fields such as electronics industry, industrial industry, national defense industry, etc. However, two major factors, low energy density and high energy storage costs, have limited the application scope of electrostatic double-layer capacitor.

In this regard, a hybrid supercapacitor combining the characteristics of an electrostatic double-layer capacitor and a lithium-ion battery has recently been developed. To be specific, the hybrid supercapacitor includes the positive electrode of an electrostatic double-layer capacitor and the negative electrode of a lithium-ion battery. Therefore, the hybrid supercapacitor features both the characteristic of high power density of the electrostatic double-layer capacitor and the characteristic of high energy density of the lithium-ion battery.

In the currently-available electrostatic double-layer capacitors or hybrid supercapacitors, carbon composite materials such as graphene are used as the positive electrode. In order to increase the energy density of an energy storage element, multiple processes are performed to improve the physical and chemical properties of graphene. However, the procedures of the abovementioned processes are complicated, and long process time and high process costs are required.

SUMMARY

In an embodiment of the disclosure, a manufacturing method of an electrode of an energy storage element includes the following steps. A substrate is provided into microwave plasma equipment first. A carrier gas and a carbon precursor gas are introduced into the microwave plasma equipment. Multi-layer graphene walls are formed on the substrate through microwave plasma chemical vapor deposition. The substrate containing the multi-layer graphene walls is immersed in an electrolyte solution to perform electrochemical activation treatment, so that ions in the electrolyte solution are intercalated between adjacent graphene walls. A volume ratio of the carrier gas to the carbon precursor gas is 1:10 to 10:1.

An embodiment of the disclosure further provides an electrode of an energy storage element.

The electrode of the energy storage element provided by an embodiment of the disclosure is formed by using the abovementioned manufacturing method of the electrode of the energy storage element, the electrode of the energy storage element includes the substrate and the graphene. The graphene is arranged on the substrate and includes the multi-layer graphene walls.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

FIG. 8A illustrates a charge-discharge curve chart of titanium sheets grown with graphene of Example 8 to Example 11 not being electrochemically activated according to the disclosure.

FIG. 8B is a charge-discharge curve chart of the titanium sheets grown with graphene of Example 8 to Example 11 after being electrochemically activated through the cyclic voltammetry according to the disclosure.

DETAILED DESCRIPTION OF DISCLOSURE EMBODIMENTS

Figure 1A:
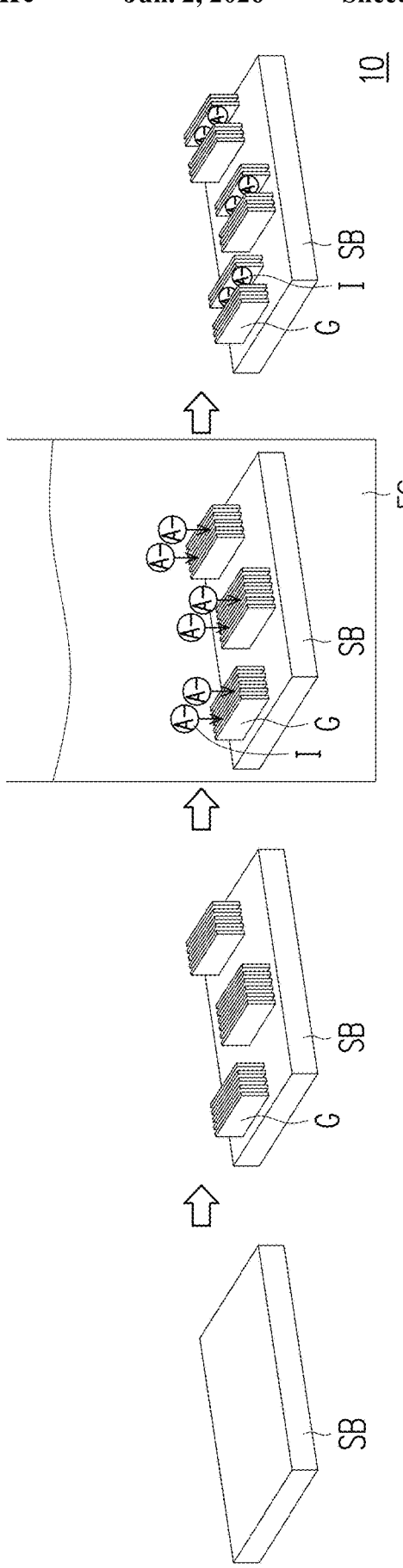
FIG. 1A illustrates a flowchart of a manufacturing method of an electrode of an energy storage element according to an embodiment of the disclosure.

The disclosure may be understood by referring to the following detailed description with reference to the accompanying drawings. It is noted that for comprehension of the reader and simplicity of the drawings, in the drawings provided in the disclosure, only a part of the electronic device is shown, and certain devices in the drawings are not necessarily drawn to actual scale. Moreover, the quantity and the size of each device in the drawings are only schematic and exemplary and are not intended to limit the scope of protection provided in the disclosure.

Directional terminologies mentioned in the disclosure, such as "top", "bottom", "front", "back", "left", "right", and so forth, refer to directions in the reference accompanying drawings. Accordingly, the directional terminologies provided herein serve to describe rather than limiting the disclosure. In the accompanying drawings, each figure illustrates methods applied in particular embodiments and general features of structures and/or materials in the embodiments. However, these figures should not be construed or defined as the scope covered by the particular embodiments. For instance, relative dimensions, thicknesses, and positions of various layers, regions, and/or structures may be reduced or enlarged for clarity.

The terminologies "about", "equal to", "equivalent to" or "same", "substantially" or "approximately" are generally interpreted as being within 10% of a given value or range, or interpreted as being within 5%, 3%, 2%, 1%, or 0.5% of a given value or range.

It should be understood that the following embodiments may replace, reorganize, and mix the features in several different embodiments to complete other embodiments without departing from the spirit of the disclosure. As long as the features of the embodiments do not violate the spirit of the disclosure or conflict each other, they may be mixed and matched as desired.

Reference will now be made in detail to the exemplary embodiments of the disclosure, and the same reference numbers are used in the drawings and descriptions to indicate the same or similar parts.

Figure 1B:
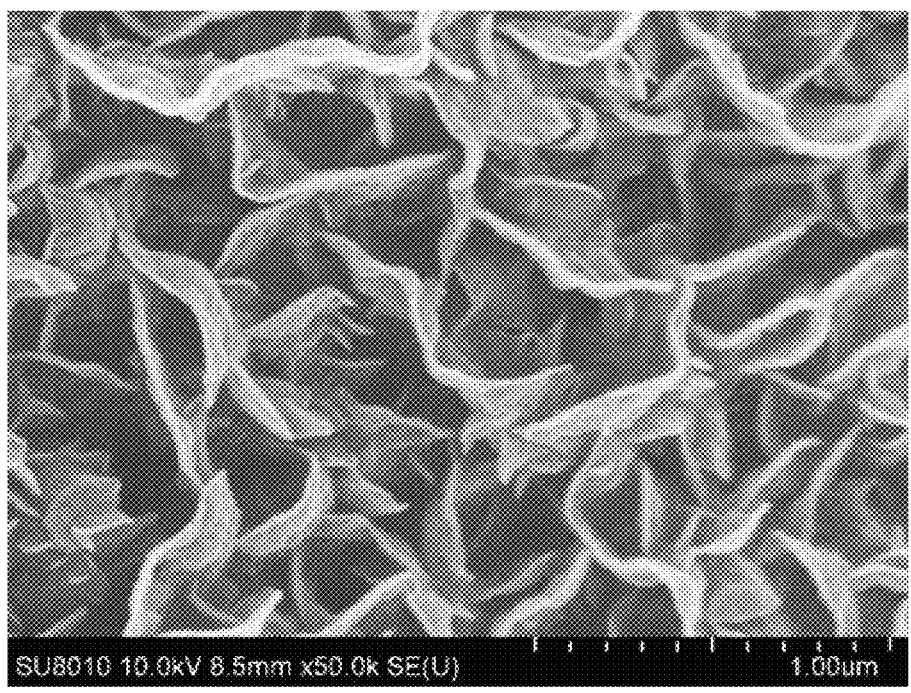
FIG. 1B and FIG. 1C illustrate scanning electron microscope (SEM) images of graphene formed by microwave plasma chemical vapor deposition in FIG. 1A.
Figure 1C:
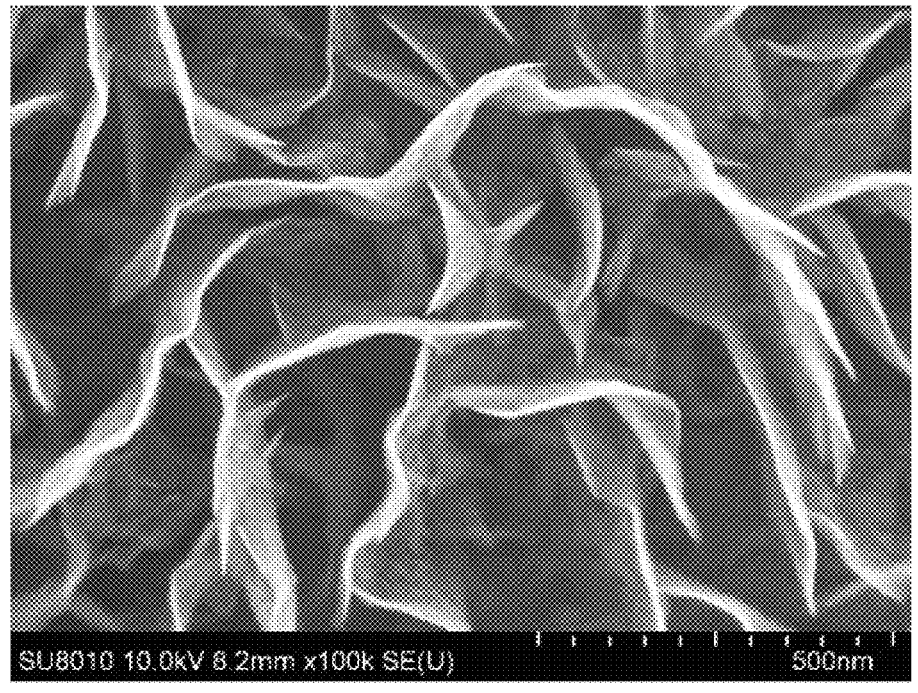

FIG. 1A illustrates a flowchart of a manufacturing method of an electrode of an energy storage element according to an embodiment of the disclosure, and FIG. 1B and FIG. 1C illustrate scanning electron microscope (SEM) images of graphene formed by microwave plasma chemical vapor deposition in FIG. 1A.

With reference to FIG. 1A, a manufacturing method of an electrode 10 of an energy storage element in this embodiment may include the following steps, but the disclosure is not limited thereto. It is worth noting that the electrode 10 of the energy storage element of this embodiment may be applied to, for example, an electrostatic double-layer capacitor (EDLC), a hybrid supercapacitor, or other suitable energy storage elements. Taking a hybrid supercapacitor as an example, a positive electrode is the electrode 10 of the energy storage element of this embodiment, and a negative electrode is a negative electrode of a lithium-ion battery (e.g., a carbon material that can be intercalated with lithium ions), but the disclosure is not limited thereto.

First, a substrate SB is provided into microwave plasma equipment (not shown). A material of the substrate SB may include, for example, a metal material, a conductive polymer material, or other conductive materials. For instance, the material of the substrate SB may include copper, gold, silver, titanium, nickel, tin, platinum, palladium, aluminum, or a combination of the foregoing. Alternatively, the material of the substrate SB may include polyaniline, polyacetylene, polyphenylvinylene, poly-p-phenylene, polypyrrole, polythiophene, or a combination of the foregoing, but the disclosure is not limited thereto.

In some embodiments, the microwave plasma equipment may include a processing chamber, a loading platform, a microwave generating element, a microwave introducing element (a waveguide), and a gas supplying element. The loading platform may be disposed in, for example, the processing chamber for carrying the substrate SB. The microwave generating element may be used to, for example, generate microwaves, and the generated microwaves may be provided into the processing chamber by, for example, the microwave introducing element. The gas supplying element may be connected to, for example, the processing chamber to provide a carrier gas and a carbon precursor gas to be described in the following paragraphs into the processing chamber.

In some embodiments, the microwave plasma equipment may also include a microwave isolator, a microwave power meter, a dual directional coupler, and a 3-stub tuner, but the disclosure is not limited thereto.

Next, the carrier gas and the carbon precursor gas are introduced into the microwave plasma equipment. In this embodiment, the carrier gas includes an inert gas. For instance, the inert gas may include argon or nitrogen. In this embodiment, the carbon precursor gas includes a hydrocarbon gas. For instance, the hydrocarbon gas may include methane ($CH_4$), ethylene ($C_2H_4$), acetylene ($C_2H_2$), or a combination of the foregoing.

Afterwards, multi-layer graphene walls are formed on the substrate through microwave plasma chemical vapor deposition.

To be specific, the microwave plasma chemical vapor deposition is performed by using carrier gas plasma generated by microwaves in the microwave plasma equipment to dissociate the carbon precursor gas, so as to form graphene G on the substrate SB. As shown in FIG. 1B and FIG. 1C, the graphene G formed on the substrate SB is in the form of, for example, multi-layer graphene walls. To be specific, in this embodiment, the graphene G formed by the microwave plasma chemical vapor deposition may include the multi-layer graphene walls with nanometer scale.

It is worth noting that when the inert gas includes nitrogen, the generated graphene may be doped with a nitrogen element to form nitrogen-doped nanographene, as shown in the following Example 12 to Example 14, FIG. 3B, and FIG. 3C.

In some embodiments, in addition to the carbon precursor gas, other Group IV precursors or Group VI precursors may also be provided. For instance, the carrier gas may be made to additionally include silicon or sulfur when the microwave plasma chemical vapor deposition is performed, so that the generated graphene may be doped with silicon or sulfur. Herein, silicon-doped nanographene is formed when the carrier gas includes silicon, and sulfur-doped nanographene is formed when the carrier gas includes sulfur, but the disclosure is not limited thereto.

In this embodiment, in the microwave plasma chemical vapor deposition, (1) a microwave frequency is greater than or equal to 300 MHz and less than or equal to 300 GHz, and (2) microwave output power is greater than 400 W and less than 75 KW.

In some embodiments, the microwave plasma chemical vapor deposition may include electron cyclotron resonance chemical vapor deposition (ECR-CVD), multi electron cyclotron resonance chemical vapor deposition (MECR-CVD), microwave plasma torch chemical vapor deposition (MPT-CVD), focused plasma chemical vapor deposition (FMP-CVD), or a combination thereof, but the disclosure is not limited thereto.

In this embodiment, the microwave plasma chemical vapor deposition includes microwave plasma torch chemical vapor deposition (MPT-CVD), which can be used to dissociate the carbon precursor through the following steps, but the disclosure is not limited thereto.

(1) The gas supplying element provides the carrier gas into the processing chamber. (2) The microwave generating element generates microwaves and provides the microwaves to the processing chamber through the microwave introducing element to form microwave plasma of the carrier gas. (3) The gas supplying element provides the carbon precursor gas into the processing chamber. Herein, the carbon precursor gas is excited by the microwave plasma to dissociate carbon atoms to grow the graphene G on the substrate.

In some embodiments, a volume ratio of the carrier gas to the carbon precursor gas is 1:10 to 10:1. In this embodiment, the volume ratio of the carrier gas to the carbon precursor gas is 1:2 to 2:1, but the disclosure is not limited thereto.

In some embodiments, the number of layers of the multi-layer graphene walls included in the graphene G is greater than or equal to 2 and less than or equal to 10. For instance, the number of layers of the multi-layer graphene walls included in the graphene G may be 3 to 5 or 5 to 10, but the disclosure is not limited thereto. In some other embodiments, the number of layers of the multi-layer graphene walls included in the graphene G is greater than 10 and less than or equal to 20.

With reference to FIG. 1 again, the substrate SB containing the graphene G is immersed in an electrolyte solution ES to perform electrochemical activation treatment, so that ions I in the electrolyte solution ES are intercalated between adjacent graphene walls. In some embodiments, the electrolyte solution may include organic salts, inorganic salts, or a combination of the foregoing. In this embodiment, the electrolyte solution includes lithium hexafluorophosphate (LiPF$_6$), lithium tetrafluoroborate (LiBF$_4$), tetraethylammonium tetrafluoroborate (TEABF$_4$), lithium bis(fluorosulfonate)imide (LiFSI), lithium bis(trifluoromethylsulfonate)imide (LiTFSI), or a combination of the foregoing, but the disclosure is not limited thereto.

In some embodiments, the electrochemical activation treatment may be performed using a constant current method, cyclic voltammetry, or a combination of the foregoing. For instance, as described in Example A below, the constant current method may be used to conduct multiple charge and discharge cycles to electrochemically activate the graphene G. Alternatively, as described in Example C below, cyclic voltammetry may be used to conduct multiple charge and discharge cycles to electrochemically activate the graphene G.

In some embodiments, an operating potential range in the electrochemical activation treatment may be greater than or equal to 0V and less than or equal to 6V, or may be greater than or equal to −6V and less than or equal to 0V. In the constant current method, the selection of the operating potential range is based on the presence of a charge and discharge platform. In the cyclic voltammetry, a positive scan from low potential to high potential and a negative scan from high potential to low potential may be performed in the operating potential range.

After the electrochemical activation treatment is performed, the ions I in the electrolyte solution ES may be intercalated between adjacent graphene walls in the graphene G through a high voltage operation to form the electrode 10 of the energy storage element of this embodiment. In some embodiments, the electrochemical activation treatment is performed for more than one cycle. For instance, the number of cycles of the electrochemical activation treatment may be from 1 to 10 times or from 1 to 20 times, but the disclosure is not limited thereto.

In summary, in the electrode 10 of the energy storage element of this embodiment, microwave plasma chemical vapor deposition is performed to form the graphene G including multi-layer graphene walls. Electrochemical activation treatment is then performed to intercalate ions I in the electrolyte solution ES between adjacent graphene walls, so that a spacing between adjacent graphene walls may expand due to the intercalation the of ions I. This phenomenon may allow a surface area of the electrode 10 of the energy storage element of this embodiment to increase and wettability to the electrolyte to be improved, so that energy density of an energy storage element including the electrode 10 of the energy storage element of this embodiment may be increased. It is worth noting that the energy density of the energy storage element may be known by evaluating an electrochemical behavior and a specific capacitance of the electrode 10 of the energy storage element through the following experimental examples, and description thereof is not provided in detail herein.

EXPERIMENTAL EXAMPLES

The following experimental examples are used to illustrate the disclosure. But these experimental examples are provided for description only and are presented as examples and are not intended to be used to limit the scope of the disclosure.

Experimental Example 1: Performing Microwave Plasma Chemical Vapor Deposition to Grow Graphene on a Substrate

Example 1

In this example, first, a titanium sheet (substrate) was provided, and the titanium sheet was soaked in a hydrochloric acid aqueous solution first, so that the titanium sheet was provided with a relatively rough surface to facilitate the growth of graphene. Next, microwave plasma torch chemical vapor deposition (MPT-CVD) was employed to grow graphene on the titanium sheet (substrate). Herein, the process conditions included: (1) the microwave frequency was 2.45 GHz; (2) the microwave output power was 610 W; (3) the carrier gas was argon; (4) the carbon precursor gas was methane; (5) a volume flow rate of argon (carrier gas) was 30 sccm and a volume flow rate of methane (carbon precursor gas) was 20 sccm, i.e., the volume ratio of the carrier gas to the carbon precursor gas was 3:2; (6) a reaction pressure of the graphene was 0.0512 torr; and (7) reaction time of the graphene was 13 minutes.

Example 2

In Example 2, the steps of growing graphene on a substrate were roughly the same as those in Example 1, and the differences therebetween mainly were: (5) the volume flow rate of argon (carrier gas) was 30 sccm and the volume flow rate of methane (carbon precursor gas) was 30 sccm, i.e., the volume ratio of the carrier gas to the carbon precursor gas was 1:1; and (6) the reaction pressure of the graphene was 0.0612 torr.

Example 3

In Example 3, the steps of growing graphene on a substrate were roughly the same as those in Example 1, and the differences therebetween mainly were: (5) the volume flow rate of argon (carrier gas) was 30 sccm and the volume flow rate of methane (carbon precursor gas) was 50 sccm, i.e., the volume ratio of the carrier gas to the carbon precursor gas was 3:5; and (6) the reaction pressure of the graphene was 0.0784 torr.

The experimental data of the above Example 1 to Example 3 are summarized in Table 1 below.

TABLE 1

| | Volume ratio of carrier gas to carbon precursor gas | Reaction time of graphene (min) | Reaction pressure of graphene (torr) | Microwave output power (W) |
|---|---|---|---|---|
| Example 1 | 3:2 | 13 | 0.0512 | 610 |
| Example 2 | 1:1 | 13 | 0.0612 | 610 |
| Example 3 | 3:5 | 13 | 0.0784 | 610 |

Figure 2:
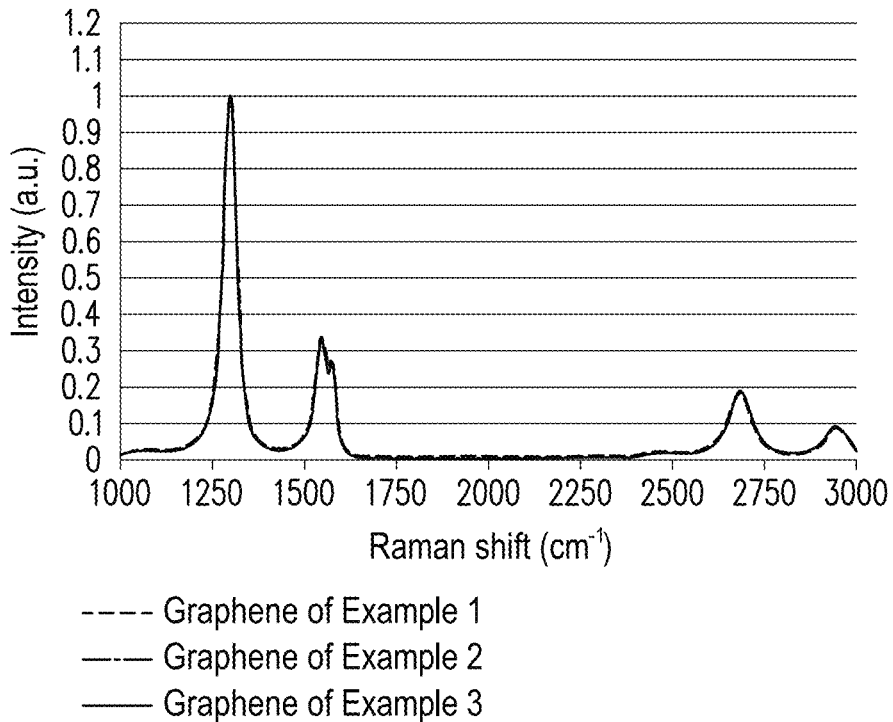
FIG. 2 illustrates Raman spectra of graphene of Example 1 to Example 3 according to the disclosure.

FIG. 2 illustrates Raman spectra of graphene of Example 1 to Example 3, where a D peak represents a ring breathing vibration mode of $sp^2$ carbon atoms of an aromatic ring in the graphene, a G peak represents an in-plane vibration mode of $sp^2$ hybridized carbon atoms of the aromatic ring in the graphene, and a 2D peak is a double frequency peak of the D peak. In this experimental example, a Raman spectrometer (model: DXR2 Raman Microscope, produced by Thermo Fisher Scientific Inc.) was used to measure the Raman spectra of the graphene in Example 1 to Example 3.

After Example 1 to Example 3 were performed, it was confirmed whether graphene was grown on the titanium sheets by the Raman spectrometer. As can be seen from FIG. 2, in Example 1 to Example 3, the D peaks of the graphene are all located at 1,349 $cm^{-1}$, the G peaks of the graphene are all located at 1,590 $cm^{-1}$, and the 2D peaks of graphene are all located at 2,689 $cm^{-1}$. It thus can be seen that the graphene is completely grown on the titanium sheets.

The Raman spectrum data of Example 1 to Example 3 and the number of layers of graphene walls are summarized in Table 2 below.

TABLE 2

| | Volume ratio of carrier gas to carbon precursor gas | $I_{2D}/I_G$ | Number of layers of graphene walls |
|---|---|---|---|
| Example 1 | 3:2 | 0.52 | 3 to 5 |
| Example 2 | 1:1 | 0.60 | 3 to 5 |
| Example 3 | 3:5 | 0.58 | 3 to 5 |

As can be seen from Table 2, the number of layers of graphene walls grown on the titanium sheet may be calculated from a ratio of peak intensity of the 2D peak to peak intensity of the G peak ($I_{2D}/I_G$) of the graphene. The $I_{2D}/I_G$ in each of Example 1 to Example 3 is approximately 0.5 to 0.6, so it can be calculated that the number of layers of graphene walls grown on the titanium sheet in each of Example 1 to Example 3 is approximately 3 layers to 5 layers.

Example 4

In Example 4, the steps of growing graphene on a substrate were roughly the same as those in Example 1, and the differences therebetween mainly were: (2) the microwave output power was 1,400 W; (5) the volume flow rate of argon (carrier gas) was 20 sccm and the volume flow rate of methane (carbon precursor gas) was 20 sccm, i.e., the volume ratio of the carrier gas to the carbon precursor gas was 1:1; (6) the reaction pressure of the graphene was 0.06 torr; and (7) the reaction time of the graphene was 3 minutes.

As can be seen from the following Table 3, in Example 4, the ratio of the peak intensity of the 2D peak to the peak intensity of the G peak ($I_{2D}/I_G$) is less than 0.2, so it can be calculated that the number of layers of graphene walls grown on the titanium sheet in Example 4 is at least greater than 10.

TABLE 3

| | Volume ratio of carrier gas to carbon precursor gas | $I_{2D}/I_G$ | Number of layers of graphene walls |
|---|---|---|---|
| Example 4 | 1:1 | 0.14 | at least greater than 10 |

Example 5

In Example 5, the steps of growing graphene on a substrate were roughly the same as those in Example 4, and the difference therebetween mainly was: (7) the reaction time of the graphene was 2 minutes.

Example 6

In Example 6, the steps of growing graphene on a substrate were roughly the same as those in Example 5, and the difference therebetween mainly was: (5) the volume flow rate of argon (carrier gas) was 20 sccm and the volume flow rate of methane (carbon precursor gas) was 50 sccm, i.e., the volume ratio of the carrier gas to the carbon precursor gas was 2:5.

Example 7

In Example 7, the steps of growing graphene on a substrate were roughly the same as those in Example 5, and the difference therebetween mainly was: (5) the volume flow rate of argon (carrier gas) was 20 sccm and the volume flow rate of methane (carbon precursor gas) was 80 sccm, i.e., the volume ratio of the carrier gas to the carbon precursor gas was 1:4.

As can be seen from the following Table 4, in Example 5, the ratio of the peak intensity of the 2D peak to the peak intensity of the G peak ($I_{2D}/I_G$) is 0.25, so it can be calculated that the number of layers of graphene walls grown on the titanium sheet in Example 5 is approximately 10. In Example 6, the ratio of the peak intensity of the 2D peak to the peak intensity of the G peak ($I_{2D}/I_G$) is 0.40, so it can be calculated that the number of layers of graphene walls grown on the titanium sheet in Example 6 is approximately 5 to 10. In Example 7, the ratio of the peak intensity of the 2D peak to the peak intensity of the G peak ($I_{2D}/I_G$)

is 0.46, so it can be calculated that the number of layers of graphene walls grown on the titanium sheet in Example 7 is at least approximately 4 to 5.

TABLE 4

|  | Volume ratio of carrier gas to carbon precursor gas | $I_{2D}/I_G$ | Number of layers of graphene walls |
|---|---|---|---|
| Example 5 | 1:1 | 0.25 | approximately 10 |
| Example 6 | 2:5 | 0.40 | 5 to 10 |
| Example 7 | 1:4 | 0.46 | 4 to 5 |

Example 8

In Example 8, the steps of growing graphene on a substrate were roughly the same as those in Example 4, and the difference therebetween mainly was: (3) the carrier gas was nitrogen.

Example 9

In Example 9, the steps of growing graphene on a substrate were roughly the same as those in Example 8, and the difference therebetween mainly was: (5) the volume flow rate of nitrogen (carrier gas) was 30 sccm and the volume flow rate of methane (carbon precursor gas) was 30 sccm.

Example 10

In Example 10, the steps of growing graphene on a substrate were roughly the same as those in Example 8, and the difference therebetween mainly was: (5) the volume flow rate of nitrogen (carrier gas) was 40 sccm and the volume flow rate of methane (carbon precursor gas) was 40 sccm.

Example 11

In Example 11, the steps of growing graphene on a substrate were roughly the same as those in Example 8, and the difference therebetween mainly was: (5) the volume flow rate of nitrogen (carrier gas) was 50 sccm and the volume flow rate of methane (carbon precursor gas) was 50 sccm.

Example 12

In Example 12, the steps of growing graphene on a substrate were roughly the same as those in Example 1, and the differences therebetween mainly were: (3) the carrier gas was nitrogen; (5) the volume flow rate of nitrogen (carrier gas) was 15 sccm and the volume flow rate of methane (carbon precursor gas) was 50 sccm, i.e., the volume ratio of the carrier gas to the carbon precursor gas was 3:10; and (6) the reaction pressure of the graphene was 0.078 torr.

Example 13

In Example 13, the steps of growing graphene on a substrate were roughly the same as those in Example 12, and the differences therebetween mainly were: (5) the volume flow rate of nitrogen (carrier gas) was 30 sccm and the volume flow rate of methane (carbon precursor gas) was 50 sccm, i.e., the volume ratio of the carrier gas to the carbon precursor gas was 3:5; and (6) the reaction pressure of the graphene was 0.0839 torr.

Example 14

In Example 14, the steps of growing graphene on a substrate were roughly the same as those in Example 12, and the differences therebetween mainly were: (5) the volume flow rate of nitrogen (carrier gas) was 50 sccm and the volume flow rate of methane (carbon precursor gas) was 50 sccm, i.e., the volume ratio of the carrier gas to the carbon precursor gas was 1:1; and (6) the reaction pressure of the graphene was 0.0998 torr.

The experimental data of the above Example 12 to Example 14 are summarized in Table 5 below.

TABLE 5

|  | Volume ratio of carrier gas to carbon precursor gas | Reaction time of graphene (min) | Reaction pressure of graphene (torr) | Microwave output power (W) |
|---|---|---|---|---|
| Example 12 | 3:10 | 13 | 0.078 | 610 |
| Example 13 | 3:5 | 13 | 0.0839 | 610 |
| Example 14 | 1:1 | 13 | 0.0998 | 610 |

Figure 3A:
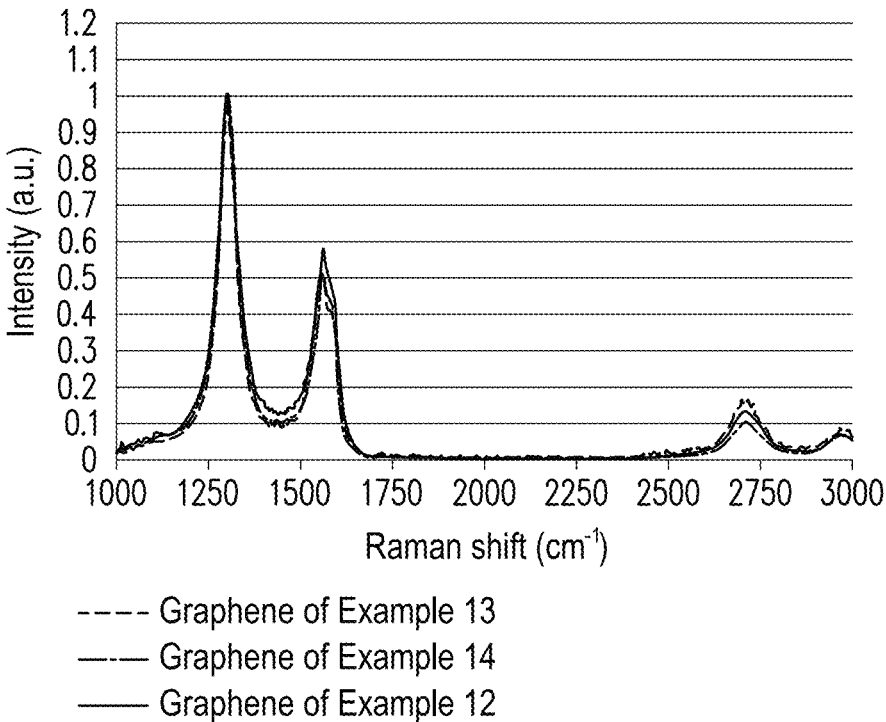
FIG. 3A illustrates Raman spectra of graphene of Example 12 to Example 14 according to the disclosure.
Figure 3B:
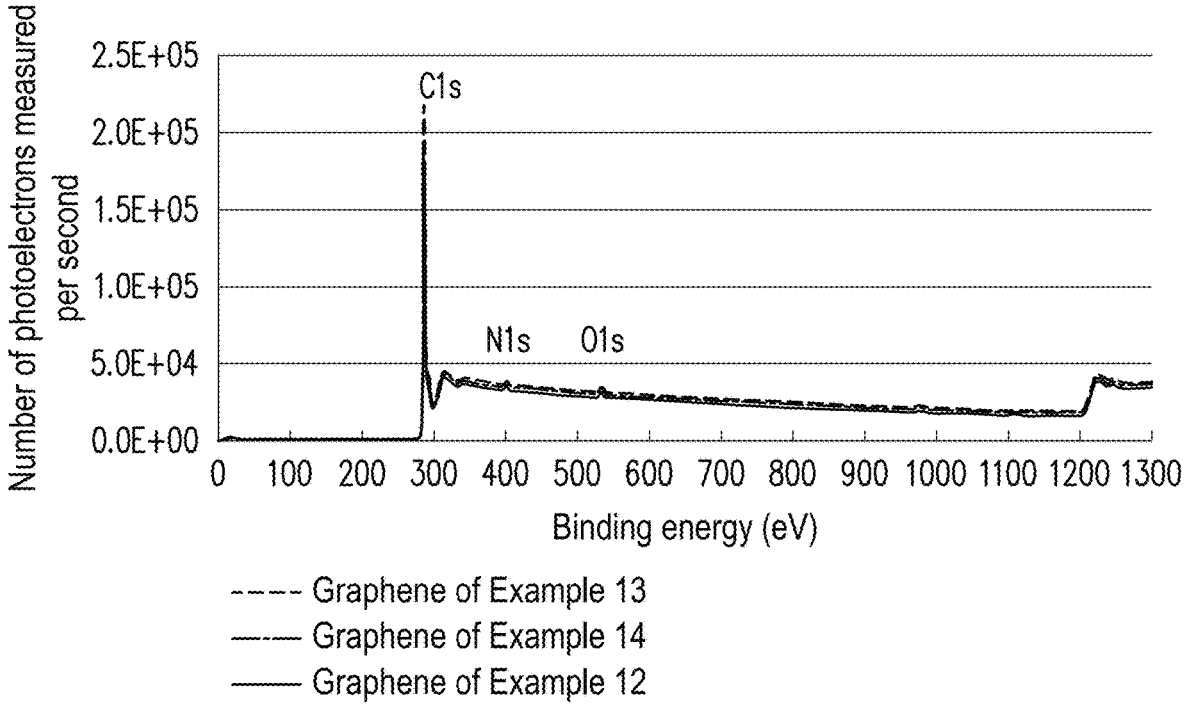
FIG. 3B and FIG. 3C illustrate X-ray photoelectron spectroscopy (XPS) spectra of the graphene of Example 12 to Example 14 according to the disclosure.
Figure 3C:
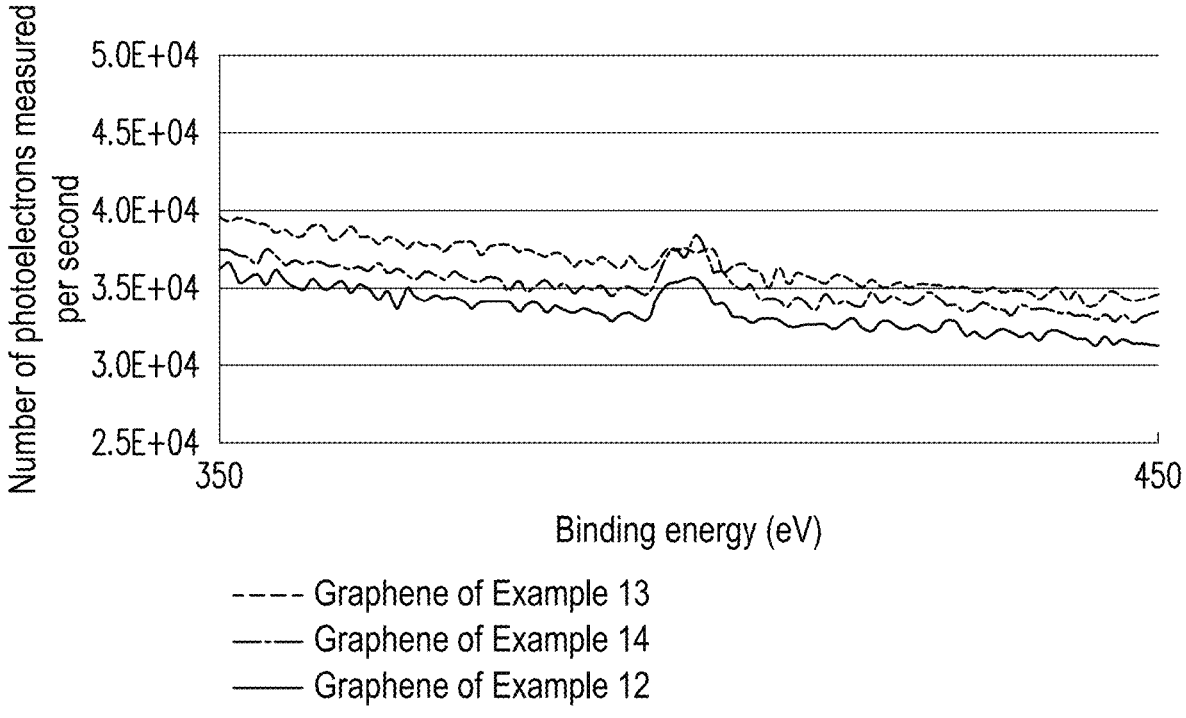

FIG. 3A illustrates Raman spectra of graphene of Example 12 to Example 14, where the D peak represents the ring breathing vibration mode of the $sp^2$ carbon atoms of the aromatic ring in the graphene, the G peak represents the in-plane vibration mode of the $sp^2$ hybridized carbon atoms of the aromatic ring in the graphene, and the 2D peak is the double frequency peak of the D peak. In this experimental example, a Raman spectrometer (model: DXR2 Raman Microscope, produced by Thermo Fisher Scientific Inc.) was used to measure the Raman spectra of the graphene in Example 12 to Example 14.

After Example 12 to Example 14 were performed, it was confirmed whether graphene was grown on the titanium sheets by the Raman spectrometer. As can be seen from FIG. 3A, in Example 12 to Example 14, the D peaks of the graphene are all located at 1,340 $cm^{-1}$ to 1,360 $cm^{-1}$, the G peaks of the graphene are all located at 1,580 $cm^{-1}$ to 1,600 $cm^{-1}$, and the 2D peaks of graphene are all located at 2,600 $cm^{-1}$ to 2,750 $cm^{-1}$. It thus can be seen that the graphene is completely grown on the titanium sheets.

In addition, X-ray photoelectron spectroscopy (XPS) was used to confirm whether nitrogen was doped into the graphene walls of Example 12 to Example 14. It can be seen from FIG. 3B and FIG. 3C (FIG. 3C enlarges a binding energy range of a signal showing N(1s) in FIG. 3B) that the intensity of the signal of N(1s) (400 eV) in Example 12 to Example 14 is obvious. Therefore, it can be confirmed that nitrogen atoms are doped in the graphene walls of Example 12 to Example 14, and a doping percentage of nitrogen atoms is approximately 1%.

The Raman spectrum data of Example 12 to Example 14 and the number of layers of graphene walls are summarized in Table 6 below.

As can be seen from the following Table 6, in Example 12 to Example 14, the ratios of the peak intensity of the 2D peak to the peak intensity of the G peak ($I_{2D}/I_G$) are respectively 0.24, 0.33, and 0.21, so it can be calculated that the numbers of layers of graphene walls grown on the titanium sheets in Example 12 to Example 14 are all greater than 10.

TABLE 6

| | Volume ratio of carrier gas to carbon precursor gas | I2D/IG | Number of layers of graphene walls |
|---|---|---|---|
| Example 12 | 3:10 | 0.24 | at least greater than 10 |
| Example 13 | 3:5 | 0.33 | at least greater than 10 |
| Example 14 | 1:1 | 0.21 | at least greater than 10 |

Experimental Example 2: Performing Electrochemical Activation Treatment on Graphene

Example A

First, the titanium sheet grown with graphene in Example 3 was immersed in an electrolyte solution, where electrolyte in the electrolyte solution was lithium hexafluorophosphate ($LiPF_6$), and a solvent was composed of ethylene carbonate (EC), ethyl methyl carbonate (EMC), and dimethyl carbonate (DMC) in a volume ratio of 1:1:1. Next, the titanium sheet grown with graphene in Example 3 was subjected to a constant current method to perform multiple charge and discharge cycles, so as to evaluate the electrochemical behavior and specific capacitance. The operating potential range in the constant current method was 0 V to 5.0 V, and current density was 0.5 A/g.

Figure 4A:
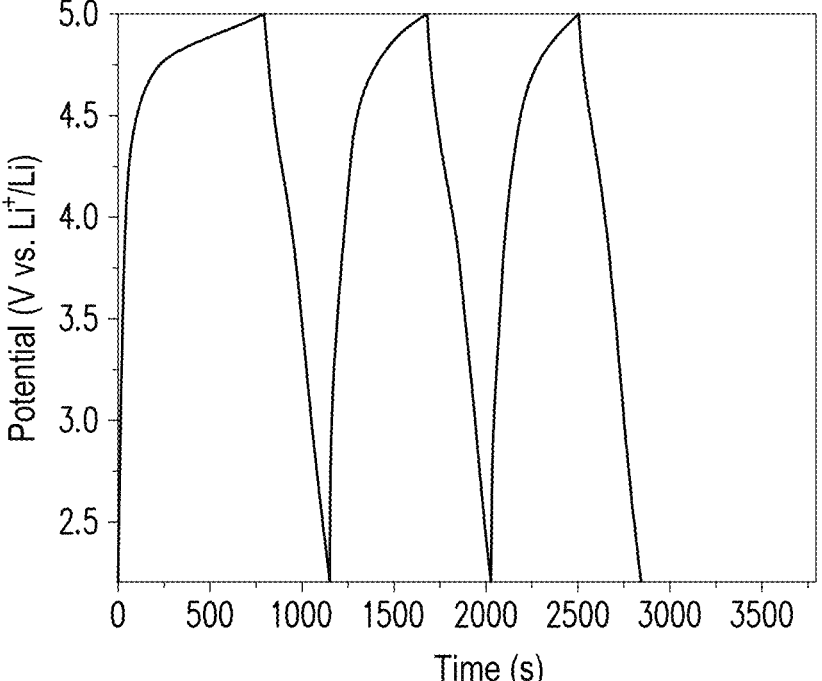
FIG. 4A illustrates a charge-discharge curve chart of a titanium sheet grown with graphene of Example 3 after being electrochemically activated through a constant current method according to the disclosure.

It can be seen from FIG. 4A that during the first charge process, a potential instantly increases to approximately 4.7 V and then there is an obvious slope change. This potential can be regarded as an initial intercalation potential of ions, that is, ions begin to intercalate between adjacent graphene walls on the titanium sheet and establish active sites for adsorption and desorption, and a plateau region is generated in the potential range from 4.7 V to 5.0 V.

After the first charge is completed, the first discharge is performed. Although the discharge curve shown in FIG. 4A has a slope change, no plateau region is formed. This slope change can be regarded as the ions no longer deintercalate in the graphene walls. To be specific, the discharge curve shown in FIG. 4A can be divided into two sections. The first section of the curve is the potential range from 5.0 V to 4.0 V, and the second section of the curve is the potential range from 4.0 V to 2.2 V. In the first section of the curve, in addition to the ion desorption behavior in an electric double layer, there is also a part of the deintercalation of ions in the graphite layer. In the second section of the curve, there is only the ion desorption behavior of the electric double layer. Therefore, the first section and the second section of the curve have different slopes.

During the second and third charge-discharge cycles, it can be seen that it has gradually approached the ion desorption behavior of a typical electric double layer. That is, fewer and fewer ions are intercalated between adjacent graphene walls on the titanium sheet, which means that the intercalation behavior of the ions should have caused irreversible effects.

Figure 4B:
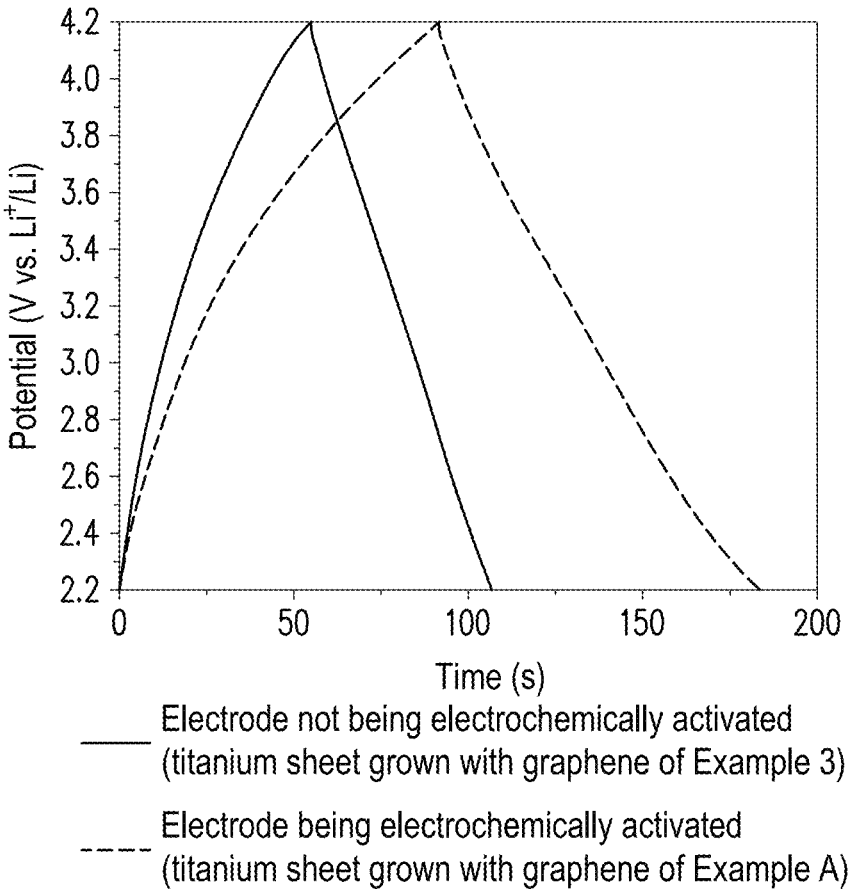
FIG. 4B illustrates a charge-discharge curve chart of the titanium sheet grown with graphene of Example 3 (1) not being electrochemically activated and (2) after being electrochemically activated through the constant current method according to the disclosure.

In addition, as can be seen from FIG. 4B that after the titanium sheet grown with graphene is electrochemically activated using a constant current method to form an electrode, it can be seen that the specific capacitance of the electrode increases from 12.9 F/g to 22.2 F/g. This means that the spacing between the graphene walls in the electrode expands after electrochemical activation treatment, so that the number of active sites in graphene that can adsorb and desorb anions increases, and that the specific capacitance increases.

Example B

The electrode of the above Example A was subjected to cyclic voltammetry to perform multiple charge and discharge cycles, so as to evaluate the electrochemical behavior and specific capacitance of the electrode. The electrode was scanned at a scan speed of 25 mV/s.

Figure 5:
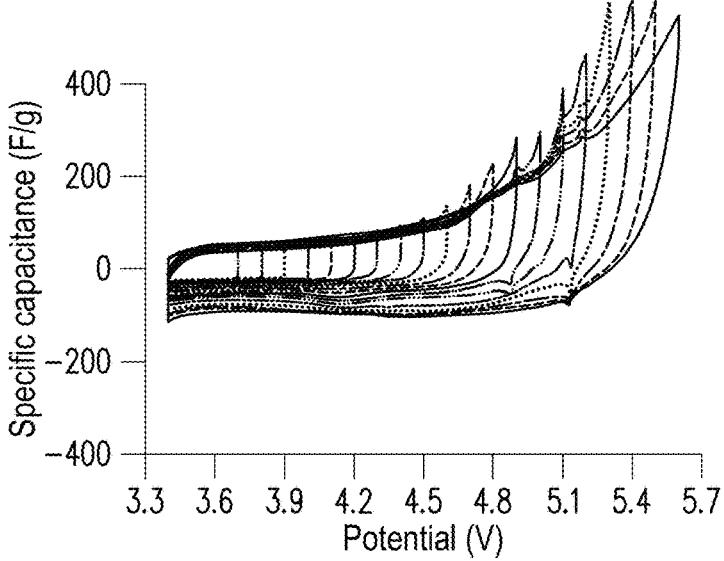
FIG. 5 illustrates a charge-discharge curve chart of the titanium sheet grown with graphene of Example 3 after being electrochemically activated through cyclic voltammetry after being subjected to the constant current method of FIG. 4A according to the disclosure.

It can be seen from FIG. 5 that a maximum potential of the electrode of Example B can withstand approximately 4.2 V, and shows a relatively square charge and discharge curve. If an upper limit potential continues to increase beyond approximately 4.8 V, although the specific capacitance of the electrode may increase as an operating potential increases, an irreversible phenomenon may occur. This is due to an oxidation reaction of the titanium sheet at this potential and/or a decomposition reaction of the electrolyte at this potential. Based on the above, FIG. 5 shows the balance between the specific capacitance of the electrode of Example B and the collapse of the electrode. In detail, it can be seen from FIG. 5 that setting the operating potential used in the cyclic voltammetry to approximately 5 V can reduce the possibility of electrode collapse while achieving a relatively large specific capacitance.

Example C

The titanium sheet grown with graphene of Example 4 was immersed in an electrolyte solution, where the electrolyte in the electrolyte solution was tetraethylammonium tetrafluoroborate ($TEABF_4$), the solvent was propylene carbonate, and the electrolyte had a concentration of 1M. Next, the titanium sheet grown with graphene of Example 4 was subjected to cyclic voltammetry to perform three charge and discharge cycles, so as to perform electrochemical activation treatment to form an electrode and to evaluate the electrochemical behavior and the specific capacitance of the electrode. The cyclic voltammetry of Example C was performed using a three-electrode system, in which a working electrode was the electrode of Example C, a corresponding electrode was a platinum wire, and the operating potential range was $-2.0$ V to 0 V. The electrochemical activation was performed for 1,600 seconds at a scan speed of 25 mV/s.

Figure 6:
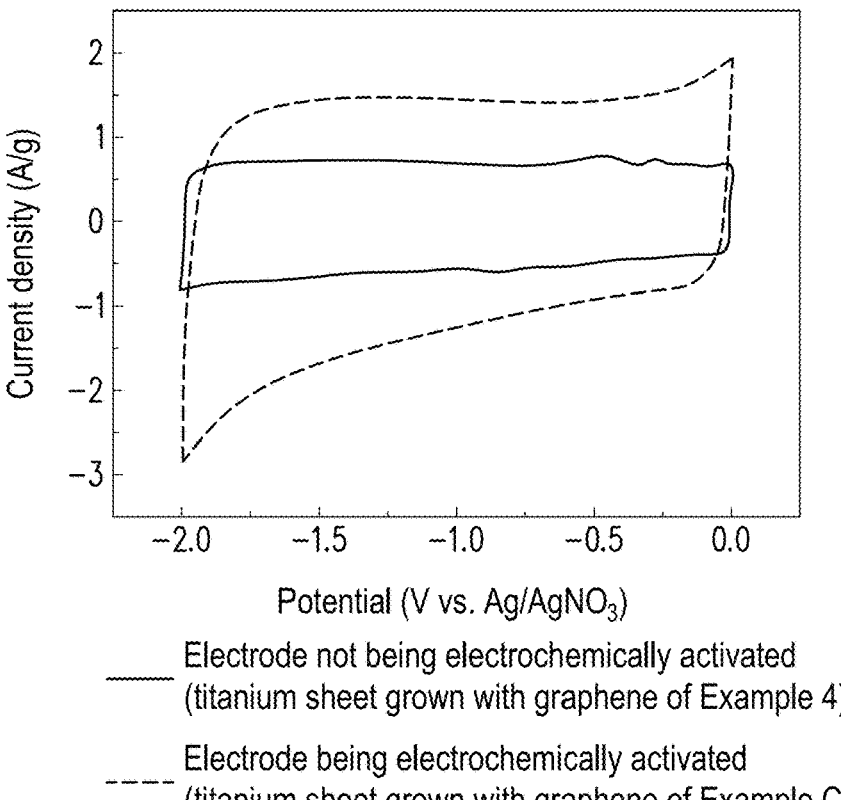
FIG. 6 illustrates a charge-discharge curve chart of a titanium sheet grown with graphene of Example 4 after being electrochemically activated through the cyclic voltammetry according to the disclosure.

FIG. 6 illustrates a cyclic voltammogram of the third charge-discharge cycle of the electrode of Embodiment C. It can be seen from FIG. 6 that the electrode of Example C exhibits a square charge and discharge curve and exhibits a good electrochemical behavior. Besides, after electrochemical activation, although it can be seen that irreversible redox peaks appear at the upper and lower limit potentials of the charge and discharge curves, these redox peaks slowly disappear as the number of scan cycles increases. It can be speculated that this is due to a pseudocapacitive behavior caused by the ions in the electrolyte solution being adsorbed on the electrode surface or intercalated in the ions during the electrochemical activation process. The abovementioned irreversible behavior also indirectly shows that some ions and solvent molecules may be trapped in graphene during the intercalation process to form molecular pillars. The specific capacitance data of Example C are summarized in Table 7 below. As can be seen from FIG. 6 and Table 7, after electrochemical activation, the specific capacitance of the electrode of Example C increases significantly, by approximately 105%.

13

14

TABLE 7

| | Specific capacitance (F/g) before electrochemical activation | Specific capacitance (F/g) after electrochemical activation | Increase percentage of specific capacitance |
|---|---|---|---|
| Example C | 27.1 | 55.6 | 105% |

Example D

The titanium sheets grown with graphene of Example 5 to Example 7 were immersed in an electrolyte solution. Next, the titanium sheets grown with graphene of Example 5 to Example 7 were subjected to cyclic voltammetry to perform three charge and discharge cycles, so as to perform electrochemical activation treatment to form electrodes of Example D1 to Example D3 respectively. The steps and conditions of cyclic voltammetry performed in Example D were the same as those in Example C.

The specific capacitance data of Example D1 to Example D3 are summarized in Table 8 below. It can be seen from Table 8 that after electrochemical activation, the specific capacitances of the electrodes of Example D1 to Example D3 all increase. The electrode of Example D1 has the largest increase percentage in specific capacitance, while the electrode of Example D3 has the smallest increase percentage of specific capacitance.

TABLE 8

| | Specific capacitance (F/g) before electrochemical activation | Specific capacitance (F/g) after electrochemical activation | Increase percentage of specific capacitance |
|---|---|---|---|
| Example D1 | 18.1 | 35.5 | 97% |
| Example D2 | 39.1 | 62.9 | 60% |
| Example D3 | 56.5 | 79.4 | 40% |

Example E

The titanium sheets grown with graphene of Example 8, Example 9, and Example 11 were immersed in an electrolyte solution, where the electrolyte in the electrolyte solution was tetraethylammonium tetrafluoroborate ($TEABF_4$), the solvent was propylene carbonate, and the electrolyte had a concentration of 1M. Next, the titanium sheets grown with graphene of Example 8, Example 9, and Example 11 were subjected to cyclic voltammetry to perform three charge and discharge cycles to form electrodes of Example E1, Example E2, and Example E4 respectively, so as to evaluate the electrochemical behaviors and the specific capacitances of the electrodes. In the cyclic voltammetry of Example E, the operating potential range is −2.4 V to 0 V and 0 V to 1.5 V, and scanning is performed at a scanning speed of 25 mV/s.

Figure 7A:
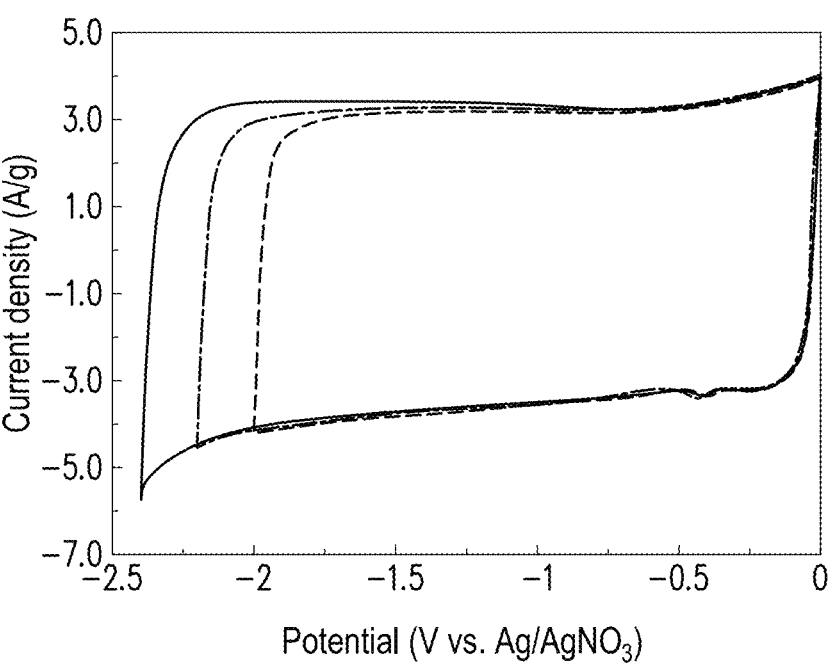
FIG. 7A illustrates a charge-discharge curve chart of titanium sheets grown with graphene of Example 8, Example 9, and Example 11 after being electrochemically activated through the cyclic voltammetry according to the disclosure, where an operating potential range is $-2.4$ V to 0 V.
Figure 7B:
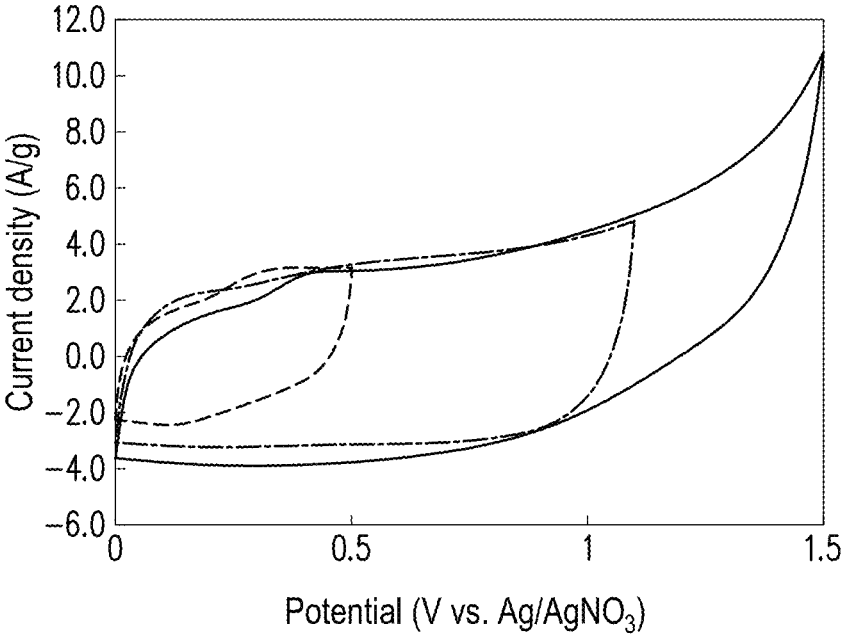
FIG. 7B illustrates a charge-discharge curve chart of the titanium sheets grown with graphene of Example 8, Example 9, and Example 11 after being electrochemically activated through the cyclic voltammetry according to the disclosure, where the operating potential range is 0 V to 1.5 V.

FIG. 7A illustrates a cyclic voltammogram of the titanium sheets grown with graphene in Example 8, Example 9, and Example 11 during charge and discharge cycles when the operating potential range is −2.4 V to 0 V. FIG. 7B illustrates a cyclic voltammogram of the titanium sheets grown with graphene in Example 8, Example 9, and Example 11 during charge and discharge cycles when the operating potential range is 0 V to 1.5 V. It can be seen from FIG. 7A that the electrodes of Example E1, Example E2, and Example E4 all exhibit square charge and discharge curves and exhibit a good electrochemical behavior. Therefore, the electrodes of Example E1, Example E2, and Example E4 are suitable as negative electrodes of supercapacitors. However, as can be seen from FIG. 7B, when the operating potential is approximately 0.8V, the current density begins to rise sharply. This is because nitrogen-containing functional groups exist in the organic phase of the electrolyte solution, and the electrolyte solution begins to decompose when the operating potential is approximately 0.8V, and the color of the solution changes from colorless to light yellow. Therefore, the electrodes of Example E1, Example E2, and Example E4 are not suitable as positive electrodes of supercapacitors.

Further, FIG. 8A illustrates a cyclic voltammogram of the electrode (the titanium sheet grown with graphene in Example 8 to Example 11) not being electrochemically activated during charge and discharge cycles when the operating potential range is −2.4 V to 0 V. FIG. 8B illustrates a cyclic voltammogram of the electrode (electrodes in Example E1 to Example E4, where the electrode of Example E3 is formed by the titanium sheet grown with graphene of Example 10 being subjected to cyclic voltammetry to perform three charge and discharge cycles) being electrochemically activated during charge and discharge cycles when the operating potential range is −2.4 V to 0 V.

The specific capacitance data of Example E1 to Example E4 are summarized in Table 9 below. From FIG. 8A to FIG. 8B and Table 9, it can be seen that after electrochemical activation, the specific capacitances of the electrodes of Example E1 to Example E3 all increase significantly.

In addition, from FIG. 8A to FIG. 8B and Table 9, it can be seen that as the volume flow rates of nitrogen and methane rise, the specific capacitance of the electrode also increases. When each of the volume flow rates of nitrogen and methane is 40 sccm, the specific capacitance of the electrode is close to the upper limit.

TABLE 9

| | Specific capacitance (F/g) before electrochemical activation | Specific capacitance (F/g) after electrochemical activation | Increase percentage of specific capacitance |
|---|---|---|---|
| Example E1 | 12.1 | 26.9 | 122% |
| Example E2 | 15.4 | 32.8 | 113% |
| Example E3 | 19.5 | 39.2 | 101% |
| Example E4 | 19.1 | 40.3 | 111% |

In view of the foregoing, in the disclosure, the microwave plasma chemical vapor deposition is employed first to grow graphene including multi-layer graphene walls. The graphene is then electrochemically activated to allow ions to be intercalated between adjacent graphene walls. Therefore, the spacing between adjacent graphene walls can be increased due to the intercalation of ions. In this way, in an embodiment of the disclosure, the surface area of the electrode of the energy storage element increases, and the wettability of the electrode to the electrolyte also is improved, so that the energy density of the energy storage element including this electrode increases. Further, in the manufacturing method of the electrode of the energy storage element provided by the disclosure, a relatively complicated process is not used, so relatively less process time is consumed and lower process costs are needed.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A manufacturing method of an electrode of an energy storage element, comprising:

providing a substrate into microwave plasma equipment;

introducing a carrier gas and a carbon precursor gas into the microwave plasma equipment;

forming multi-layer graphene walls on the substrate through microwave plasma chemical vapor deposition; and immersing the substrate containing the multi-layer graphene walls in an electrolyte solution to perform electrochemical activation treatment, so that ions in the electrolyte solution are intercalated between adjacent graphene walls, wherein a volume ratio of the carrier gas to the carbon precursor gas is 1:10 to 10:1.

2. The manufacturing method of the electrode of the energy storage element according to claim 1, wherein the number of cycles of performing the electrochemical activation treatment is one or more.

3. The manufacturing method of the electrode of the energy storage element according to claim 1, wherein the carbon precursor gas comprises a hydrocarbon gas.

4. The manufacturing method of the electrode of the energy storage element according to claim 1, wherein the microwave plasma chemical vapor deposition comprises electron cyclotron resonance chemical vapor deposition (ECR-CVD), multi electron cyclotron resonance chemical vapor deposition (MECR-CVD), microwave plasma torch chemical vapor deposition (MPT-CVD), focused plasma chemical vapor deposition (FMP-CVD), or a combination thereof.

5. The manufacturing method of the electrode of the energy storage element according to claim 1, wherein a microwave frequency used in the microwave plasma chemical vapor deposition is greater than or equal to 300 MHz and less than or equal to 300 GHz.

6. The manufacturing method of the electrode of the energy storage element according to claim 1, wherein microwave output power used in the microwave plasma chemical vapor deposition is greater than 400 W and less than 75 KW.

7. The manufacturing method of the electrode of the energy storage element according to claim 1, wherein the volume ratio of the carrier gas to the carbon precursor gas is 1:2 to 2:1.

8. The manufacturing method of the electrode of the energy storage element according to claim 1, wherein the number of layers of the multi-layer graphene walls is greater than or equal to 2 and less than or equal to 10.

9. The manufacturing method of the electrode of the energy storage element according to claim 1, wherein the number of layers of the multi-layer graphene walls is greater than 10 and less than or equal to 20.

10. The manufacturing method of the electrode of the energy storage element according to claim 1, wherein a material of the substrate comprises a metal material, wherein the metal material is selected from copper, gold, silver, titanium, nickel, tin, platinum, palladium, aluminum, or a combination of the foregoing.

11. The manufacturing method of the electrode of the energy storage element according to claim 1, wherein a material of the substrate comprises a conductive polymer material, wherein the conductive polymer material is selected from polyaniline, polyacetylene, polyparastyrene, polyparaphenylene, polypyrrole, polythiophene, or a combination of the foregoing.

12. The manufacturing method of the electrode of the energy storage element according to claim 1, wherein the electrolyte solution comprises $LiPF_6$, $LiBF_4$, $TEABF_4$, LiFSI, LiTFSI, or a combination of the foregoing.

13. The manufacturing method of the electrode of the energy storage element according to claim 1, wherein the performing the electrochemical activation treatment comprises performing a constant current method, cyclic voltammetry, or a combination of the foregoing.

14. The manufacturing method of the electrode of the energy storage element according to claim 1, wherein an operating potential range in the electrochemical activation treatment is greater than or equal to 0V and less than or equal to 6V, or greater than or equal to −6V and less than or equal to 0V.

15. The manufacturing method of the electrode of the energy storage element according to claim 1, wherein the carrier gas comprises argon or nitrogen.

16. An electrode of an energy storage element formed by using the manufacturing method of the electrode of the energy storage element according to claim 1, the electrode of the energy storage element comprising:

the substrate; and the graphene arranged on the substrate and comprising the multi-layer graphene walls.

17. The electrode of the energy storage element according to claim 16, wherein the number of layers of the multi-layer graphene walls is greater than or equal to 2 and less than or equal to 10.

18. The electrode of the energy storage element according to claim 16, wherein the number of layers of the multi-layer graphene walls is greater than 10 and less than or equal to 20.

19. The electrode of the energy storage element according to claim 16, wherein a material of the substrate comprises a metal material, wherein the metal material is selected from copper, gold, silver, titanium, nickel, tin, platinum, palladium, aluminum, or a combination of the foregoing.

20. The electrode of the energy storage element according to claim 16, wherein a material of the substrate comprises a conductive polymer material, wherein the conductive polymer material is selected from polyaniline, polyacetylene, polyparastyrene, polyparaphenylene, polypyrrole, polythiophene, or a combination of the foregoing.

21. The electrode of the energy storage element according to claim 16, wherein the graphene is doped with nitrogen, silicon, or sulfur.

* * * * *